United States Patent
Schad et al.

(10) Patent No.: US 9,923,330 B2
(45) Date of Patent: Mar. 20, 2018

(54) PUMPING LIGHT SYSTEMS FOR DISC LASERS

(71) Applicant: TRUMPF LASER GMBH, Schramberg (DE)

(72) Inventors: Sven-Silvius Schad, Rottweil (DE); Alois Herkommer, Stuttgart (DE); Matthias Ackermann, Rottweil (DE)

(73) Assignee: TRUMPF LASER GMBH, Schramberg (DE)

( * ) Notice: Subject to any disclaimer, the term of this patent is extended or adjusted under 35 U.S.C. 154(b) by 0 days.

(21) Appl. No.: 15/497,906

(22) Filed: Apr. 26, 2017

(65) Prior Publication Data

US 2017/0310069 A1 Oct. 26, 2017

(30) Foreign Application Priority Data

Apr. 26, 2016 (DE) .................. 10 2016 207 017

(51) Int. Cl.
*H01S 3/08* (2006.01)
*H01S 3/04* (2006.01)
(Continued)

(52) U.S. Cl.
CPC .......... *H01S 3/08059* (2013.01); *H01S 3/042* (2013.01); *H01S 3/0405* (2013.01);
(Continued)

(58) Field of Classification Search
CPC .... H01S 3/08059; H01S 3/0405; H01S 3/042; H01S 3/0604; H01S 3/08068;
(Continued)

(56) References Cited

U.S. PATENT DOCUMENTS

| 6,891,847 B1 | 5/2005 | Gubbi |
| 8,824,522 B2 | 9/2014 | Schad et al. |

(Continued)

FOREIGN PATENT DOCUMENTS

| DE | 102011004204 A1 | 8/2012 |
| DE | 102013114748 A1 | 6/2015 |

(Continued)

OTHER PUBLICATIONS

Erhard, Steffen, "Pumpoptiken und Resonatoren für den Scheibenlaser", Dissertation with English abstract, University of Stuttgart, 117 pages, 2002.

(Continued)

*Primary Examiner* — Armando Rodriguez
(74) *Attorney, Agent, or Firm* — Fish & Richardson P.C.

(57) ABSTRACT

This disclosure relates to pumping light systems and methods for using a disc laser. A focusing device with a reflecting surface focuses a pumping light beam onto a laser-active medium. A deflecting system deflects the pumping light beam between reflecting regions formed on the reflecting surface that are arranged in different angle regions around a central axis of the reflecting surface in at least a first annular region and a second annular region. The deflecting systems are configured to perform at least one deflection of the pumping light beam between two reflecting regions of the first annular region and at least one deflection between two reflecting regions of the second annular region.

25 Claims, 3 Drawing Sheets

(51) Int. Cl.
| | |
|---|---|
| *H01S 3/042* | (2006.01) |
| *H01S 3/06* | (2006.01) |
| *H01S 3/081* | (2006.01) |
| *H01S 3/091* | (2006.01) |
| *H01S 3/094* | (2006.01) |
| *H01S 3/0941* | (2006.01) |
| *H01S 5/00* | (2006.01) |

(52) U.S. Cl.
CPC ............ *H01S 3/0604* (2013.01); *H01S 3/081* (2013.01); *H01S 3/08068* (2013.01); *H01S 3/091* (2013.01); *H01S 3/094084* (2013.01); *H01S 3/09415* (2013.01); *H01S 5/005* (2013.01); *H01S 5/0071* (2013.01)

(58) Field of Classification Search
CPC .... H01S 3/081; H01S 3/091; H01S 3/094084; H01S 3/09415; H01S 5/005; H01S 5/0071
See application file for complete search history.

(56) References Cited

U.S. PATENT DOCUMENTS

| | | |
|---|---|---|
| 8,824,552 B2 | 9/2014 | Nakagomi et al. |
| 2006/0209918 A1 | 9/2006 | Wang et al. |
| 2014/0016662 A1 | 1/2014 | Schad et al. |

FOREIGN PATENT DOCUMENTS

| | | |
|---|---|---|
| EP | 1252687 B1 | 12/2008 |
| WO | WO2015091995 A1 | 6/2015 |

OTHER PUBLICATIONS

Stewen, Christian, "Scheibenlaser mit Kilowatt-Dauerstrichleistung", Dissertation with English abstract, University of Stuttgart, 146 pages, 2002.

European Patent Office Extended Search Report for European Application No. EP 17 16 3786 dated Oct. 11, 2017 (5 pages).

PUMPING LIGHT SYSTEMS FOR DISC LASERS

CROSS-REFERENCE TO RELATED APPLICATION

This application claims priority under 35 U.S.C. § 119(a) to German Application No. 10 2016 207 017.7, filed on Apr. 26, 2016, the entire contents of which are incorporated herein by reference.

TECHNICAL FIELD

The present invention relates to a pumping light system for a disc laser

BACKGROUND

Disc lasers have a laser-active medium (a gain medium) of a small thickness (laser disc), which can be cooled well. As a result, the concept of the disc laser is suitable for high laser powers in the multi-kilowatt range. Because of the small thickness of the gain medium, however, little pumping light is absorbed in a single pass through the laser-active medium, which without the provision of suitable measures would have the consequence of a low efficiency of the laser system when pumping the laser-active medium. Multiple passes of the pumping radiation through the laser-active medium are generally warranted to obtain a minimum energy or minimum laser power required for satisfying the laser condition in the laser-active medium. In the case of such multiple passes, the pumping light beam is repeatedly focused onto the laser-active medium, ideally a 1:1 imaging of the pumping spot being produced in successive focusing steps. The repeated imaging via the concave mirror leads to an impairment of the collimation in the parallel beam path, so that the collimated beam diameter increases and the power coupled into the laser-active medium decreases, which limits the number of multiple passes.

EP 1 252 687 B1 and the dissertation "Pumpoptiken and Resonatoren für Scheibenlaser" [Pumping Optics and Resonators for Disc Lasers], S. Erhard, University of Stuttgart, 2002, ISBN 3-8316-0173-9, discloses a pumping arrangement in which the pumping light beam is focused onto the laser-active medium with the aid of a parabolic mirror. The multiple passes are achieved by the pumping light beam being deflected repeatedly with the aid of deflecting devices, for example prisms, between different reflecting regions that lie in different sectors of a circle in one and the same annular region of the parabolic mirror.

The dissertation "Scheibenlaser mit Kilowatt-Dauerstrichleistung" [Disc Laser with Kilowatt Continuous-Wave Power], C. Stewen, University of Stuttgart, 2002, ISBN 3-89675-763, discloses using multiple annular regions with reflecting regions on the parabolic mirror for the imaging by using multiple deflecting units, the individual rings being arranged radially in a segment of the parabolic mirror.

DE 10 2011 004 204 A1 discloses a pumping light arrangement having a reflecting surface that may have two, three or more annular regions with multiple reflecting regions. A deflection of the pumping light beam within a respective annular region takes place in the azimuthal direction.

Greater distances between the reflecting regions and the central axis of the reflecting surface, can yield greater imaging errors. In particular, for the case where three or more annular regions are used to deflect the pumping light beam or focus the pumping light beam onto the laser-active medium, at least the radially outermost annular region can beat a distance from the central axis of the reflecting surface that is so great that the imaging errors increase greatly, so that there is a noticeable expansion of the pumping light beam, which may possibly lead to so-called clipping effects (cutting-off losses) at deflecting devices, for example in the form of prisms.

If a pumping light source of a high beam quality is used, the beam diameter with which the pumping light beam coming from the pumping light source impinges on the reflecting surface is comparatively small. Therefore, the reflecting surface can be made to extend in the radial direction, thereby reducing or minimizing the problematic matter of beam expansion. However, pumping light sources of a high beam quality, for example diode lasers, are expensive. In particular, in the case of high pumping powers, however, pumping light sources that are as inexpensive as possible should be used, with which the aforementioned effects can occur.

SUMMARY

Various embodiments disclosed herein provide pumping light systems for disc lasers and associated methods for pumping a laser-active medium that make it possible to compensate for imaging errors in the repeated focusing of the pumping light beam onto the laser-active medium.

In one aspect, the disclosure provides pumping light systems including a focusing device with a reflecting surface for focusing a pumping light beam onto a laser-active medium. In certain embodiments the focusing device includes a concave mirror. The pumping light systems also include a deflecting system comprising a plurality of deflecting devices for deflecting the pumping light beam between reflecting regions formed on the reflecting surface that are arranged in different angle regions around a central axis of the reflecting surface in at least a first annular region and a second annular region. The deflecting system is configured to perform at least one deflection of the pumping light beam between two reflecting regions of the first annular region and at least one deflection between two reflecting regions of the second annular region.

The deflecting devices are configured to perform a number of deflections between two reflecting regions of the two annular regions with an image reversal of the pumping light beam in the radial direction in relation to the central axis. The number of deflections between the two reflecting regions of the two annular regions with an image reversal of the pumping light beam in the radial direction corresponds to at least one third of the total number of deflections between two reflecting regions of the two annular regions. In certain embodiments, the number of deflections with an image reversal corresponds to at least half of the total number of deflections between two reflecting regions of the two annular regions.

In some implementations, the pumping light beam emanating from the pumping light source impinges on the reflecting surface, formed for example aspherically, as a paraboloid, for example, in a collimated state and generally with an elliptical beam cross section parallel to the central axis. The pumping light beam with the elliptical beam cross section is imaged as a round image on the laser-active medium by the reflecting surface in particular embodiments. The reflecting regions are generally formed circularly in a projection onto a plane perpendicular to the central axis. When reference is made hereinafter to circular reflecting regions, this relates in each case to the projection into a plane perpendicular to the central axis.

In the deflection between two reflecting regions with the aid of the deflecting system, the pumping light beam is generally in a collimated state. Between a first deflection by means of the deflecting system and a subsequent second deflection by means of the deflecting system, the pumping light beam is focused by the focusing device onto the laser-active medium and, after passing through the laser-active medium, is re-collimated. In some implementations, the laser-active medium is formed as a laser disc that is arranged in a focal plane or at the focal point or in the focal plane of the focusing device, for example in the form of a parabolic mirror. However, the focal length of such a parabolic mirror has a quadratic dependence on the angle of incidence and is therefore only approximately constant for small angles of incidence of the impinging pumping light beam.

The greater the distance of the pumping light beam impinging on the reflecting surface from the central axis, the greater the angle of incidence, and the greater the change of the focal length. The pumping light beam used in the pumping light system has a beam cross section that is so great in the radial direction that, in particular in the case of reflecting regions that are at a great distance from the central axis, the differences between the angles of incidence of the radially inner and outer marginal rays of the pumping light beam lead to an imaging error. This imaging error occurs each time that the pumping light beam is focused onto the laser-active medium between two successive deflections. The imaging errors in the repeated focusing onto the laser-active medium are cumulative and lead to an expansion of the pumping light beam, and possibly to the clipping effects described further above at the deflecting devices, if the pumping light beam radiates beyond these.

On account of the imaging error, telecentric imaging is generally achieved for one bundle of rays of the pumping light beam, which is generally the middle zone, i.e., the bundle of rays of the pumping light beam that runs in the middle of the beam cross section. The beam path at the radially outer and inner margins of the pumping light beam are generally not corrected by changing the distance between the deflecting device and the reflecting surface. Accordingly, the bundles of rays that are away from the center of the beam cross section of the pumping light beam in the radial direction, in particular the marginal rays, have an unstable beam path, which leads to the expansion of the pumping light beam described further above.

The inventors have recognized that this imaging error can be compensated by an image reversal of the pumping light beam in the radial direction in the deflection with the deflecting device. In the image reversal, the beam cross-section of the pumping light beam is mirrored in the radial direction so that radially inner and radially outer bundles of rays of the pumping light beam are interchanged. The effect of the different focal length of the reflecting surface on the bundles of rays of the pumping light beam impinging at a different radial distance from the central axis is therefore reversed in a subsequent focusing so that the imaging error that has occurred in a previous focusing can be compensated.

In certain implementations the number of deflections with the radial image reversal corresponds to at least half the total number of deflections between two of the reflecting surfaces of the two annular regions. In some implementations, a smaller number of deflections with radial image reversal may also take place, for example more than a third of the deflections with radial image reversal, to achieve a partial compensation of the imaging errors. In the case of a total number of deflections that is uneven or not divisible by three, the half or third of the total number of deflections is understood as meaning the number of deflections rounded down to the nearest smaller integral value.

In particular embodiments, the deflecting system is designed to perform a deflection of the pumping light beam from a reflecting region of the first annular region onto a reflecting region of the second annular region, or vice versa, for an image reversal of the pumping light beam in the radial direction in relation to the central axis. In some embodiments, the deflection between two reflecting regions that are formed on two different annular regions takes place in the form of a 180° deflection, for example with the aid of deflecting devices in the form of prisms or if appropriate in the form of bundles of fibers. In such a 180° deflection, an image reversal of the beam cross section of the pumping light beam can take place automatically (substantially) in the radial direction. Also in the 180° deflection between two reflecting regions in one and the same annular region, an image reversal can take place, though (substantially) in the azimuthal direction. An azimuthal deflection between two reflecting regions of the first annular region or between two reflecting regions of the second annular region does not produce a radial image reversal, and therefore does not contribute to a compensation of the imaging errors described further above.

In particular embodiments, the deflecting system is designed to perform a (precisely one) deflection of the pumping light beam from a reflecting region of the first annular region onto a reflecting region of the second annular region, or vice versa, between each deflection of the pumping light beam between two reflecting regions of the first annular region and each deflection of the pumping light beam between two reflecting regions of the second annular region.

For the compensation of the imaging errors described further above, it is advantageous if the deflections of the pumping light beam in two neighboring annular regions, which in particular form the two annular regions of the reflecting surface that are outermost in the radial direction, takes place in alternation between a deflection in the radial direction and a deflection in the azimuthal direction, since imaging errors occurring in two directly successive focusings of the pumping light beam are thereby mutually compensated.

In particular implementations, the deflecting system is designed to perform at least two deflections in the radial direction, i.e., to deflect the pumping light beam both at least once from a reflecting region of the first annular region onto a reflecting region of the second annular region and also at least once in the reverse direction, i.e., from a reflecting region of the second annular region onto a reflecting region of the first annular region. At least in one of the two annular regions, generally in both annular regions, the pumping light beam is deflected at least twice in the azimuthal direction.

In certain embodiments, the deflecting system is designed to perform a number of deflections of the pumping light beam from a reflecting region of the first annular region onto a reflecting region of the second annular region, or vice versa, that deviates by no more than one from the number of deflections between two reflecting regions of the first annular region and between two reflecting regions of the second annular region.

In particular implementations, the number of deflections in the radial direction, i.e. between the two annular regions, is chosen to be equal to the number of deflections in the azimuthal direction, i.e. the sum of the deflections between the reflecting regions of the first annular region and the deflections between the reflecting regions of the second annular region. In other words, the total number of deflections is divided in equal parts into radial deflections and azimuthal deflections. Such a division is only possible if the total number of deflections is an even number. If the total number of deflections is an uneven number, for dividing the total number of deflections as evenly as possible between radial deflections and azimuthal deflections, the number of radial deflections can be chosen to be greater by one than the number of azimuthal deflections, or vice versa. In this way, the imaging error described further above is compensated virtually completely even in cases of great distances of the reflecting regions from the central axis.

In certain embodiments, the deflecting system has at least one deflecting device for deflecting the pumping light beam between two reflecting regions of the reflecting surface that comprises two deflecting faces that are in particular aligned mirror-symmetrically in relation to a plane of symmetry. In particular implementations, the two deflecting faces are aligned at an angle of 90° in relation to one another and bring about in each case a deflection of the pumping light beam through 90°, to produce the 180° deflection. If one of the two deflecting faces has a variable distance from the plane of symmetry in a direction perpendicular to the plane of incidence, at least the surface portion of this deflecting face that lies in the plane of incidence of the pumping light beam may be arranged mirror-symmetrically in relation to the plane of symmetry.

The deflecting device described above produces an image reversal of the pumping light beam with respect to the plane of symmetry. If the plane of symmetry is aligned substantially in the azimuthal direction, as is generally the case in the radial deflection between two reflecting regions from different annular regions, an image reversal in the radial direction automatically takes place in a deflecting device designed in such a way.

In some implementations, at least one deflecting device is designed for the additional image reversal of the pumping light beam with respect to a plane of incidence of the pumping light beam, e.g., perpendicularly to the plane of symmetry. The additional image reversal allows a deflecting device that is used for the deflection in the azimuthal direction, i.e. between two reflecting regions of one and the same annular region, also to produce a radial image reversal. It is consequently not absolutely necessary to perform a deflection in the radial direction for the radial image reversal. For example, as in the case of conventional pumping light systems, to compensate for imaging errors a deflection in a respective annular region may in this case take place exclusively in the azimuthal direction (with the exception of the coupling in or out of the pumping light beam). In particular, in this case more than half of the deflections, in particular each deflection in the azimuthal direction, may take place with an image reversal in the radial direction in relation to the central axis.

In some implementations, the deflecting faces are formed on one or more prisms. The deflecting device may for example be designed as a 180° deflecting prism by utilizing total reflection at the short faces serving as deflecting faces. It is however also possible for example to use two prisms (or a biprism) with in each case a mirrored hypotenuse face as a deflecting face with the 180° deflecting device with beam offset. Alternatively, two plane mirrors, the reflective deflecting faces of which are aligned at an angle of 90° in relation to one another and that possibly touch at a common edge, may for example also be used for the deflection.

In particular implementations, one of the two deflecting faces for the additional image reversal of the pumping light beam with respect to a plane of incidence of the pumping light beam is formed on a roof prism. A roof prism (invented by Amici) in combination with the other deflecting face, which may for example be formed on a conventional prism or a mirror, makes possible a complete image reversal of the pumping light beam in the 180° deflection. As described further above, such a complete image reversal allows an image reversal in the radial direction to be produced even in the case of a deflecting device that serves for the deflection between (in particular neighboring) reflecting regions of one and the same annular region. The roof edge of the roof prism is, for example, arranged in the plane of incidence (and emergence) of the pumping light beam.

Instead of deflecting devices with deflecting faces, in particular perpendicular to one another, if appropriate other types of deflecting devices, for example fiber bundles, may also be used as deflecting devices. Also, as described above, a 180° deflection of the pumping light beam does not necessarily have to be performed. However, a deflecting device that is favorable in principle is one that merely produces a reversal of the direction of propagation of the pumping light beam together with a beam offset, i.e. a deflection that reverses the direction of propagation of the pumping light beam and displaces it in parallel, and upon the deflection performs the mirroring described further above of the beam profile of the pumping light beam, i.e. an image reversal in one direction, or if appropriate a complete image reversal.

In certain embodiments, the deflecting system is designed to perform the deflection of the pumping light beam between two azimuthally neighboring reflecting regions of the first annular region and between two azimuthally neighboring reflecting regions of the second annular region. It is advantageous to minimize imaging errors if the deflection in the azimuthal direction takes place between directly neighboring reflecting regions. However, an azimuthal deflection between reflecting regions of the first annular region or the second annular region that are not neighboring can be implemented.

In certain embodiments, the deflecting system is designed to perform the deflection of the pumping light beam between two radially neighboring reflecting regions of the first annular region and of the second annular region. A deflection of the pumping light beam between two reflecting regions neighboring in the radial direction of a respective annular region has likewise proven to be favorable with regard to the reduction of imaging errors.

In particular embodiments, the number of reflecting regions of the first annular region and of the second annular region is equal. For an even division of the total number of deflections, it is favorable if both annular regions have an identical number of reflecting regions. With the two annular regions, a reflecting region to couple the pumping light beam into one of the two annular regions and a reflecting region to couple the pumping light beam out of the other of the two annular regions are employed, for example, to reflect the pumping light beam back on itself at a retroreflector or end mirror or deflect it to a further annular region. The number of reflecting regions that are available at a respective annular region for the azimuthal deflection and the radial deflection is therefore typically less by one than the total number of reflecting regions of a respective annular region.

In some embodiments, both the first and the second annular region have a number of fourteen reflecting regions. It has been found that such a number of reflecting regions of the reflecting surface is advantageous on the one hand with regard to the imaging errors and on the other hand with regard to the installation space that is required for the deflecting devices.

In particular embodiments, the reflecting surface comprises at least a third, radially inner annular region, which is surrounded (annularly) by the first and second annular regions of the reflecting surface. As described further above, an even division of the deflections into radial and azimuthal deflections is favorable in particular in the case of annular regions that are far away from the central axis of the reflecting surface. Such an even division is not absolutely necessary in the case of the third and any further radially inner annular regions, but may likewise be performed if at least two radially inner annular regions are present. In some implementations, if only a single radially inner annular region is present, a purely azimuthal deflection takes place between the reflecting regions of this annular region, as is the case for example in the document DE 10 2011 004 204 A1 cited further above.

As described further above, the number of passes through the laser-active medium can be doubled if the pumping light beam is reflected back on itself at a deflecting unit in the form of a retroreflector, for example a planar end mirror. For example, with a number of 36 reflecting regions, the use of a retroreflector allows a number of 72 passes through the laser-active medium to be realized.

In particular embodiments, the third, inner annular region has a number of eight reflecting regions. The number of reflecting regions of the inner annular region is made to match the number of reflecting regions of the two outer annular regions, the installation space that is required for the deflecting devices being taken into account. The use of eight reflecting regions has been found to be particularly advantageous.

In some embodiments, the deflecting system is designed to deflect the pumping light beam at least twice directly in succession between two reflecting regions of the third annular region. As described further above, in the case of the third annular region, an azimuthal deflection of the pumping light beam can take place, i.e. a deflection in the radial direction, for example in relation to a possibly present fourth, further radially inward annular region, does not generally take place in each case between two azimuthal deflections. Such a deflection substantially in the azimuthal direction is favorable in particular when using deflecting prisms as deflecting devices, since with a deflection in which the collimated pumping light beam propagates through the center of the pumping system there are generally clipping losses due to the inner set of prisms of the deflecting system.

It has likewise proven to be favorable if, for deflecting the pumping light beam between two of the reflecting regions in the radial direction or in the azimuthal direction, the deflecting system has in each case a dedicated deflecting device, i.e. a dedicated structural unit. One and the same deflecting device may be designed for deflecting the pumping light beam between a number of reflecting regions in accordance with particular embodiments, as is described for example in the document DE 10 2011 004 204 A1 cited at the beginning, which is incorporated by reference into the content of this application in its entirety.

In some embodiments, the reflecting surface has an aspherical form, in particular a parabolic form. The reflecting surface may in particular have an aspherical form that deviates slightly from a parabolic form. In some implementations, a concave mirror serves as the focusing device. The concave mirror can have an (approximately) parabolic reflecting surface, to achieve the effect that the pumping light beam coming from the laser-active medium is collimated at the (rotationally symmetrical) reflecting surface. If appropriate, this function may also be performed by other aspherical surfaces, or if appropriate a segmentation or faceting of the concave mirror may be performed, each of the facets typically being assigned to a respective one of the reflecting regions.

In particular embodiments, the pumping light system additionally comprises a pumping light source for generating the pumping light beam. The pumping light source thereby produces pumping light, which emerges at a beam emerging surface, the diameter of which determines the minimum diameter of the pumping light beam. The pumping light source also defines the divergence (or the opening angle) of the pumping light beam, and thereby determines the beam parameter product of the pumping light beam.

In certain embodiments, the pumping light system additionally comprises a collimating optics arranged in the beam path between the pumping light source and the reflecting surface for the collimation of the pumping light beam. The collimated pumping light beam impinges on the reflecting surface and produces there a generally circular reflecting region (or spot). As described further above, the radiating of a collimated pumping light beam onto the reflecting surface is favorable, since after focusing onto the laser-active medium this beam is reflected back by the latter to the reflecting surface and re-collimated by the (parabolic) reflecting surface, so that ideally the beam diameter is not increased in the deflection. To increase the number of passes, if appropriate a coupling optics, as described in DE 10 2013 114 748 A1 and designed for producing an input coupling focus in the coupling in of the pumping light beam from the pumping light source in the direction of the reflecting surface, may also be used instead of a collimating optics. As likewise described in DE 10 2013 114 748 A1, the input coupling focus may for example be arranged in the region of an intermediate-focus deflecting optics of a beam-field-guiding system.

A further aspect of the invention relates to a disc laser with a pumping light system as described further above and also with a laser-active medium in the form of a laser disc. The disc laser (or possibly the disc laser amplifier) has a resonator in certain implementations, which may be formed for example between a mirrored rear side of the laser-active medium (laser disc) and an element for coupling out laser radiation or a laser beam, and that may be for example a (partially transmissive) coupling-out mirror. In the resonator, laser radiation is produced with a wavelength that is dependent on the type of laser-active medium, the wavelength of the laser radiation produced by the laser-active medium typically deviating from the wavelength of the pumping light source. The laser-active medium of the disc laser is repeatedly passed through by the pumping light beam without any excessively great losses due to clipping effects or due to imaging errors thereby occurring, as a result of which the efficiency of the disc laser can be increased.

A further aspect of the invention relates to a method for pumping a laser-active medium. The method includes repeatedly focusing a pumping light beam onto a laser-active medium by a focusing device. The focusing device includes a concave mirror, in accordance with certain implementations. A deflection of the pumping light beam between different reflecting regions of a reflecting surface of the focusing device that are arranged in different angle regions around a central axis of the reflecting surface in at least a first annular region and a second annular region takes place between successive focusing steps. The pumping light beam is deflected at least once both between two reflecting regions of the first annular region and between two reflecting regions of the second annular region. The angular region in which a respective reflecting region is formed may be, for example, a segment of a circle of the reflecting surface of the focusing device. In the method a number of deflections are performed between two reflecting regions of the two annular regions with an image reversal of the pumping light beam in the radial direction in relation to the central axis. The number of deflections performed between the two reflecting regions of the two annular regions with the image reversal of the pumping light beam in the radial direction corresponds to at least one third of the total number of deflections between two reflecting regions of the two annular regions. In certain implementations, the number of deflections performed with the image reversals corresponds to at least half of the total number of deflections. As described above, in these ways imaging errors in successive focusings can be compensated (virtually) completely, so that an increase in the collimated beam diameter is counteracted and in this way the efficiency when pumping the laser-active medium can be increased.

Further advantages of the invention emerge from the description and the drawing. Similarly, the features mentioned above and features still to be set out can each be used on their own or together in any desired combinations. The embodiments shown and described should not be understood as an exhaustive list, but rather as being of an exemplary character for the description of the invention.

DETAILED DESCRIPTION

In the following description of the drawings, identical reference numerals are used for components that are the same or functionally the same.

Figure 1:
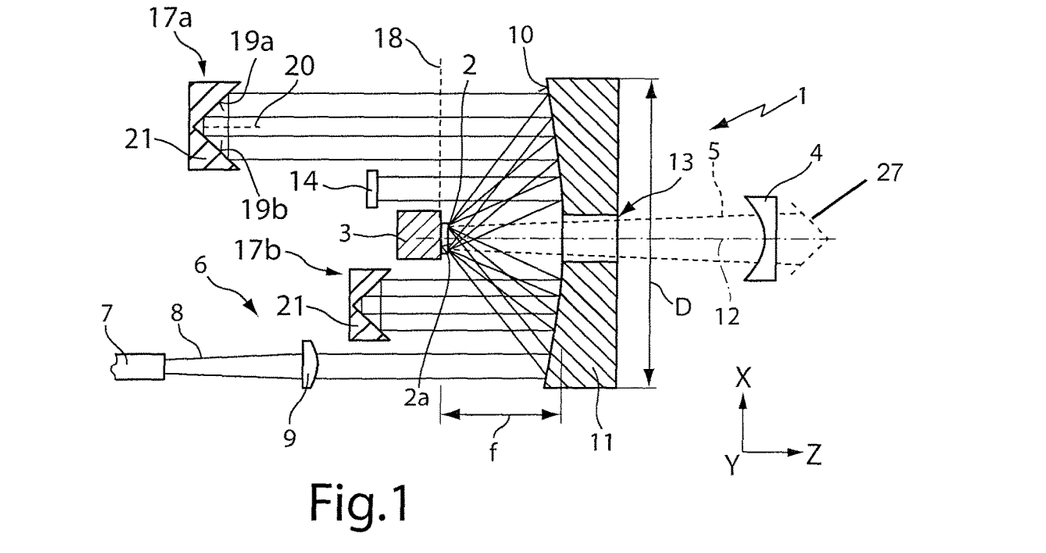
FIG. 1 shows a schematic representation of an exemplary embodiment of a disc laser with a pumping light system.

FIG. 1 shows by way of example a disc laser 1, which has a laser-active medium 2 in the form of a laser disc, which for cooling is arranged on a heat sink 3. Applied on the side of the laser disc 2 that is facing the heat sink 3 is a reflective coating 2a, which together with a partially transmissive coupling-out mirror 4 forms a resonator for laser radiation 5 that is produced by excitation of the laser-active medium 2 and leaves the resonator through the partially transmissive coupling-out mirror 4, as indicated in FIG. 1 by arrow 27.

For the excitation of the laser-active medium 2, the disc laser 1 has a pumping light system 6 with a pumping light source 7, which generates an initially divergent pumping light beam 8, which is collimated at a collimating optics represented for the sake of simplicity in FIG. 1 in the form of a single lens 9. The collimated pumping light beam 8 impinges on a reflecting surface 10, which is formed on a concave mirror 11. The reflecting surface 10 extends rotationally, symmetrically in relation to a central axis 12 of the concave mirror 11 and is parabolically curved, i.e. the concave mirror 11 forms a parabolic mirror. The collimated pumping light beam 8 impinges on the reflecting surface 10 parallel to the central axis 12 of the concave mirror 11. The concave mirror 11 has a central opening 13 for the laser radiation 5 produced in the laser-active medium 2 to pass through.

The collimated pumping light beam 8 is reflected at the parabolic reflecting surface 10 and focused onto the laser-active medium 2 arranged at the focal point or in the focal plane 18 of the concave mirror 11 (with focal length f). A beam emerging surface of the pumping light source 7 is thereby imaged onto the laser-active medium 2 in the focal plane 18 in an imaging scale that is determined by the focal length f of the parabolic mirror 11 and the focal length (not shown) of the collimating lens 9. The pumping light beam 8 is subsequently reflected at the reflective coating 2a on the rear side of the laser-active medium 2, impinges divergently onto the reflecting surface 10, and is re-reflected at the latter. The reflected pumping light beam 8 is collimated on account of the parabolic geometry of the reflecting surface 10 and subsequently impinges onto a deflecting system 15, which is presented in detail further below in conjunction with FIG. 5.

Figure 2:
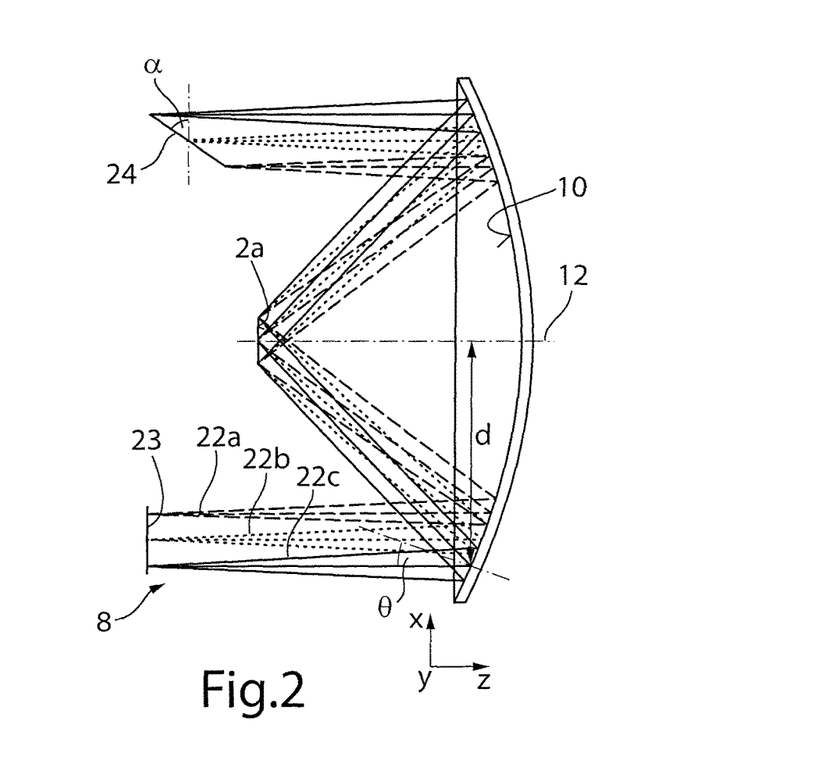
FIG. 2 shows a schematic representation of the beam path of three bundles of rays of a pumping light beam emanating from the entry pupil, which impinge at different angles of incidence on a parabolic reflecting surface.

FIG. 2 shows the beam path of the pumping light beam 8, to be more specific of three bundles of rays 22a-c of the pumping light beam 8, between an entry pupil plane 23 and a further pupil plane 24. The three bundles of rays 22a-c are arranged at different distances from the central axis 12 of the reflecting surface 10 in the radial direction (corresponding to the X direction of FIG. 2), and therefore impinge at different angles of incidence θ on the reflecting surface 10, for the sake of simplicity only the angle of incidence θ of the third, radially outermost bundle of rays 22c being shown in FIG. 2. As can be seen in FIG. 2, the further pupil plane 24, which is formed after the focusing of the bundle of rays 22a-c onto the reflective coating 2a of the laser-active medium 2 and the renewed collimation at the reflecting surface 10 of the bundles of rays 22a-c or of the pumping light beam 8, is inclined or tilted at an angle of inclination α with respect to a plane (XY plane) perpendicular to the central axis 12, which extends in the Z direction.

Figure 3A:
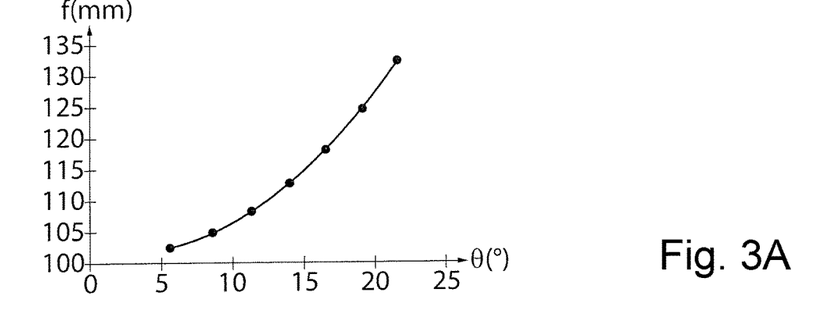
FIGS. 3A and 3B show schematic representations of the dependence of the focal length of the reflecting surface on the angle of incidence and also the dependence of the angle of inclination of a pupil plane of the pumping light beam on the distance from a central axis of the reflecting surface.
Figure 3B:
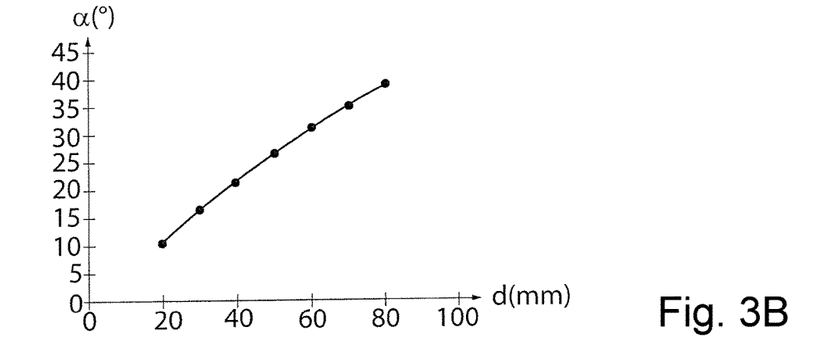

The cause of the inclination of the further pupil plane 24 lies in the dependence of the focal length f (cf. FIG. 1) of the parabolic reflecting surface 10 on the angle of incidence θ, which in the example shown nominally lies at f=100 mm, which however according to FIG. 3A increases substantially quadratically with the angle of incidence θ. Since the angle of incidence θ increases with increasing distance d of the pumping light beam 8 from the central axis 12, the angle of inclination α of the further pupil plane 24 likewise increases with increasing distance d from the central axis 12, as is shown in FIG. 3B.

Due to the inclination of the further pupil plane 24, the telecentricity condition can no longer be satisfied simultaneously in the (2f) imaging of the pumping light beam 8 for all of the bundles of rays 23a-c running at different distances from the central axis 12 in the radial direction. In certain implementations, the deflecting devices 17a, 17b shown in FIG. 1 of the deflecting system 25 (cf. FIG. 5) are arranged at such a distance from the reflecting surface 10 that the telecentricity condition is satisfied in the middle, i.e. the middle bundle of rays 23b has an ideal telecentricity, so that only the middle bundle of rays 23b is reproduced in multiple deflections, while all of the other bundles of rays, in particular the radially innermost bundle of rays 23a and the radially outermost bundle of rays 23c, have an unstable beam path. This has the effect that these two outer bundles of rays 23a, 23c expand when there are multiple successive focusings, the expansion increasing with the number of focusings. This expansion may have the effect that the beam cross section of the pumping light beam 8 becomes so great that cutting-off losses occur at the deflecting devices 17a, 17b shown in FIG. 1, since the pumping light beam 8 radiates beyond the deflecting surfaces 19a, 19b of the deflecting devices 17a, 17b.

Figure 4:
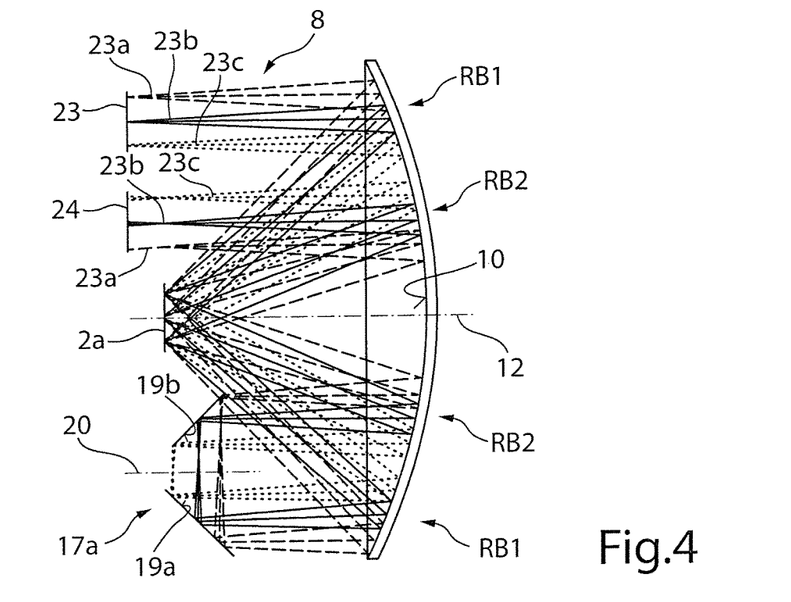
FIG. 4 shows a schematic representation analogous to FIG. 2 with a deflecting device that brings about an image reversal in the radial direction.

To correct the imaging error described in FIG. 2, so that the (further) pupil plane 24 has an angle of inclination α of (approximately) 0°, a radial image reversal of the pumping light beam 8 may be performed at a radial deflecting device 17a with two deflecting faces 19a, 19b, which in each case bring about a deflection of the pumping light beam 8 through 90°, as is shown in FIG. 4. The pumping light beam 8 emerging from the entry pupil 23, of which three bundles of rays 23a-c are shown in FIG. 4 by way of analogy with FIG. 2, impinges in a first, radially outer annular region RB1 onto the reflecting surface 10, is focused at the latter onto the laser-active medium 2, is reflected back by the reflective coating 2a of the laser-active medium 2 to the first annular region RB1 and is deflected by the latter parallel to the central axis 12 to the deflecting device 17a.

At the two deflecting faces 19a, 19b of the radial deflecting device 17a that are arranged mirror symmetrically in relation to a plane of symmetry 20, a twofold 90° deflection of the pumping light beam 8 takes place. The 180° deflection at the radial deflecting device 17a takes place in the radial direction, so that the pumping light beam 8 reflected back by the deflecting device 17a is deflected parallel to the central axis 12 into a second, radially further inward annular region RB2. The deflecting device 17a also produces an image reversal of the pumping light beam 8, to be more specific of the beam cross section of the pumping light beam 8, to be more precise a mirroring of the beam cross section of the pumping light beam 8 at the plane of symmetry 20. In the example shown, the plane of symmetry 20 extends in the azimuthal direction, so that the image reversal of the pumping light beam 8 takes place in the radial direction.

The radial image reversal has the effect that the first bundle of rays 23a, which runs radially outwards before the deflection at the radial deflecting device 17a, runs radially inwards after the 180° deflection at the radial deflecting device 17a. The third bundle of rays 23c runs correspondingly, running radially inwards before the deflection at the radial deflecting device 17a and radially outwards after the deflection. In the subsequent focusing of the pumping light beam 8 onto the laser-active medium 2 and the collimation and deflection at the second annular region RB2, the imaging error described further above is largely corrected, so that the (further) pupil plane 24 extends approximately in a plane perpendicular to the central axis 12, i.e. has a (virtually) vanishing angle of inclination (α=0°). A deflecting system 15, which produces an alternating deflection of the pumping light beam in the radial direction (with radial image reversal) and in the azimuthal direction (without radial image reversal), consequently allows the imaging error described above to be compensated virtually completely in the deflection at the first and second annular regions RB1, RB2, as described below on the basis of FIG. 5 for a deflecting system 15 with three annular regions RB1 to RB3.

Figure 5:
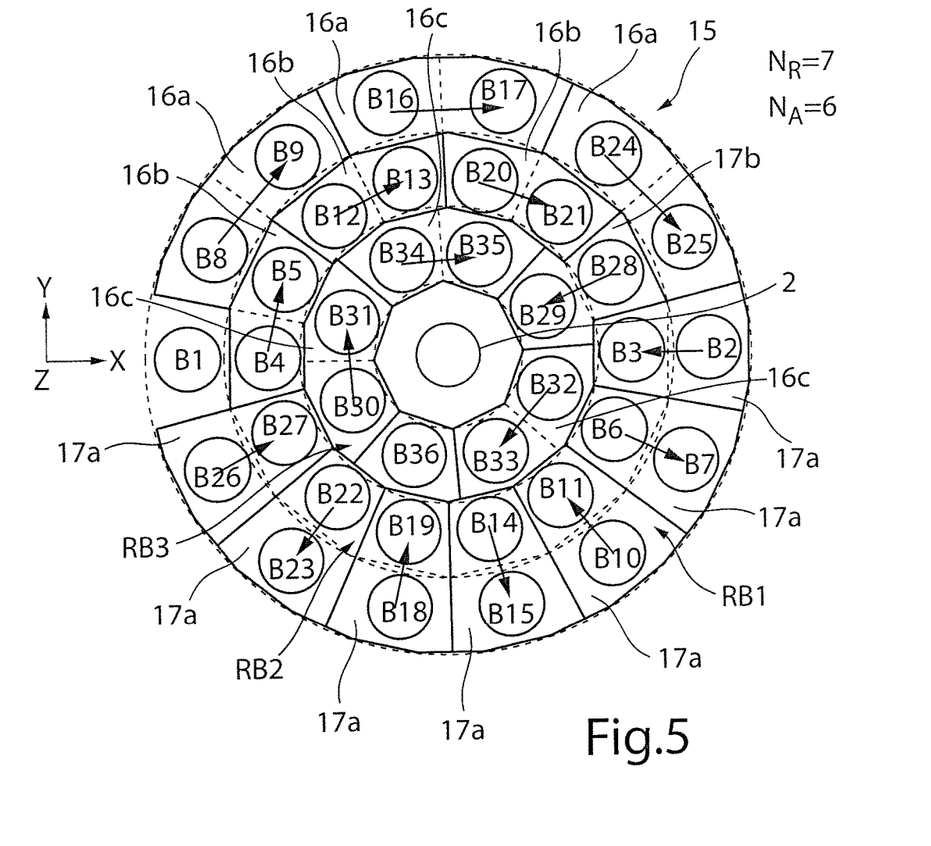
FIG. 5 shows a representation of a reflecting surface of the pumping light system with reflecting regions that are arranged in three annular regions, and also with a deflecting system with deflecting devices for the deflection of the pumping light beam between two respective ones of the reflecting regions.

The deflecting system 15 shown in FIG. 5 has multiple deflecting devices 16a-c, 17a,b, which are designed to deflect the pumping light beam 8 in each case between two reflecting regions B1 to B36 of the reflecting surface 10 that are likewise shown in FIG. 5.

The designation of the reflecting regions B1 to B36 corresponds to the sequence in which these are passed through by the pumping light beam 8. As can be seen in FIG. 5, the reflecting regions B1 to B36 are arranged in first to third annular regions RB1 to RB3 about the central axis 12 of the reflecting surface 10. The first, radially outer annular region RB1 and the second annular region RB2, which adjoins the first annular region RB1 in the radial direction, have in each case a number of fourteen reflecting regions, which in the azimuthal direction (i.e. in the circumferential direction) are arranged in different angle regions or sectors of a circle. The third, radially inner annular region RB3 has a number of eight reflecting regions, which are likewise arranged in different angle regions in the azimuthal direction. The pumping light beam 8 passes through the reflecting regions B1 to B36 in series and is thereby deflected both at the laser-active medium 2 and at the deflecting system 15 shown in FIG. 5, as described in detail below:

The pumping light beam 8 first impinges in a collimated state onto a first reflecting region B1 of the reflecting surface 10, which is formed at the first annular region RB1, is focused by the first reflecting region B1 onto the laser-active medium 2 and impinges once again onto the reflecting surface 10 at a second reflecting region B2 of the first annular region RB1. The pumping light beam 8 is reflected at the second reflecting region B2 and leaves it in a collimated state and parallel to the central axis 12 and impinges on a radial deflecting device 17a of the deflecting system 15, as can be seen in FIG. 1. The pumping light beam 8 is deflected at the radial deflecting device 17a, the direction of propagation of the pumping light beam 8 being reversed and a radial beam offset of the pumping light beam 8 being produced.

The pumping light beam 8 is thereby deflected by the second reflecting region B2 in the first annular region RB1 to a third reflecting region B3 in the second annular region RB2 of the reflecting surface 10, as can be seen in FIG. 5. The second and third reflecting regions B2, B3 are arranged neighboring in the radial direction. The radial deflecting device 17a for the deflection of the pumping light beam 8 from the second reflecting region B2 to the third reflecting region B3 has in the example shown a biprism 21, which, as shown in FIG. 1 or in FIG. 5, has two planar deflecting faces 19a, 19b aligned symmetrically in relation to a common plane of symmetry 20. In the example shown, all of the deflecting devices 16a-c, 17a,b of the deflecting system 15 have an identical construction, i.e. they are formed in each case as biprisms. There are altogether in the deflecting system 15 two types of radial deflecting devices 17a,b and three types of azimuthal deflecting devices 16a-c for the deflection of the pumping light beam 8 between the respective reflecting regions B1 to B36, which differ from one another merely in their dimensions and in their alignment.

The pumping light beam 8 is subsequently focused by the third reflecting region B3 onto the laser-active medium 2 and, after the reflection at the reflective coating 2*a*, impinges onto a fourth reflecting region B4, which is likewise formed at the second annular region RB2 of the reflecting surface 10, see FIG. 2. The pumping light beam 8 is deflected by an azimuthal deflecting device 16*b* of the deflecting system 15 in the azimuthal direction to a neighboring, fifth reflecting region B5 of the second annular region RB2.

The pumping light beam 8 is reflected by the fifth reflecting region B5 to the laser-active medium 2 and from there to a sixth reflecting region B6 of the second annular region RB2, and is subsequently deflected by means of a further radial deflecting device 17*a* in the radial direction to a seventh reflecting region B7 in the first annular region RB1. The further radial deflecting device 17*a* is constructed identically to the radial deflecting device 17*a*, which serves for the deflection of the pumping light beam 8 between the second and third reflecting regions B2, B3. The pumping light beam 8 is subsequently deflected via the laser-active medium 2 onto an eighth reflecting region B8 in the first annular region RB1. An azimuthal deflecting device 16*a* serves for the deflection of the pumping light beam 8 in the azimuthal direction from the eighth reflecting region B8 to a ninth, directly neighboring reflecting region B9 of the first annular region RB1.

The pumping light beam 8 is deflected by the ninth reflecting region B9 via the laser-active medium 2 to a tenth reflecting region B10 of the first annular region RB1. Subsequently, the pumping light beam 8 is deflected once again, as described further above, in the radial direction from the tenth reflecting region B10 to an eleventh reflecting region B11 of the second annular region RB2. The alternating deflection of the pumping light beam 8 in the radial direction between two reflecting regions B10, B11; B14, B15; B18, B19; B22, B23; B26, B27 of the two annular regions RB1, RB2 with the aid of a respective radial deflecting device 17*a* and in the azimuthal direction between two reflecting regions B16, B17; B24, B25 in each case of the first annular region RB1 or between two reflecting regions B12, B13; B20, B21 of the second annular region RB2 with the aid of azimuthal deflecting devices 16*a*, 16*b* is subsequently repeated until the pumping light beam 8 has reached a twenty-eighth reflecting region B28 of the second annular region RB2 (cf. FIG. 5).

From there, the pumping light beam 8 is deflected by means of a radial deflecting device 17*b* in the radial direction to a radially neighboring reflecting region B29 of the third annular region RB3. Subsequently, the pumping light beam 8 is deflected in the way described further above between two respective azimuthally neighboring reflecting regions B30, B31; B32, B33; B34, B35 of the third annular region RB3, a focusing onto the laser-active medium 2 taking place in each case between two azimuthal deflections.

The pumping light beam 8 is deflected by a thirty-sixth reflecting region B36 to an end mirror 14 (cf. FIG. 1), which reflects the pumping light beam 8 back onto itself, so that the pumping light beam 8 passes once again through the reflecting regions B1 to B36 in the reverse direction along the same beam path. The pumping light beam 8 in this way passes through the laser-active medium 2 altogether seventy-two times. Both the end mirror 14 and the radial deflecting device 17*b* for the deflection of the pumping light beam 8 into the third annular region RB3 are only shown in the plane of the drawing in FIG. 1 to simplify the representation, and that they are arranged in different angle regions about the central axis 12, as can be seen in FIG. 2.

At the deflecting device 15 described further above, the pumping light beam 8 is deflected alternately in the azimuthal direction between two (azimuthally neighboring) reflecting regions B8, B9; B16, B17; B24, B25 of the first annular region RB1 or between two (azimuthally neighboring) reflecting regions B4, B5; B12, B13; B20, B21 of the second annular region RB2. In the example shown, the number NR of radial deflections between the first and second annular regions RB1, RB2 is NR=7. The number NA of azimuthal deflections in the first annular region RB1 and in the second annular region RB2 is altogether NA=6, i.e., the number of azimuthal deflections NA deviates by one from the number of radial deflections NR in the first and second annular regions RB1, RB2.

A division of the total number NR+NA of deflections between the deflections NR in the radial direction and the deflections NA in the azimuthal direction that is as even as possible is favorable in the case of the first and second radially outer annular regions RB1, RB2, because imaging errors that lead to a beam expansion in the deflection between reflecting regions B1 to B36 increase with increasing distance from the central axis 12 of the reflecting surface 10 (see above). The substantially even division of the total number NR+NA of deflections between deflections NR in the radial direction and deflections NA in the azimuthal direction in the first and second annular regions RB1, RB2 by means of the radial deflecting devices 17*a* and the azimuthal deflecting devices 16*a,b* allows the imaging errors or the beam expansion in the reflection of the pumping light beam 8 to be compensated to the greatest extent, and in this way an increased efficiency of the pumping light system 6 or of a disc laser 1 provided with it to be achieved. Since the third, radially inner annular region RB3 is arranged at a smaller distance from the central axis 12, a purely azimuthal deflection of the pumping light beam 8 may take place there, without excessively great imaging errors thereby occurring.

The deflecting devices 16*a-c*, 17*a,b* may be formed differently from the type of construction described further above: for example, two individual prisms, in each case with a mirrored deflecting face 19*a*, 19*b*, may be used instead of a biprism 21. The use of two deflecting faces aligned at an angle of 90° in relation to one another and formed on two mirrors is also possible. The deflecting devices may for example also be formed as 180° deflecting prisms by utilizing total reflection at the short faces serving as deflecting faces. If appropriate, bundles of fibers or the like may also be used as deflecting devices.

Figure 6:
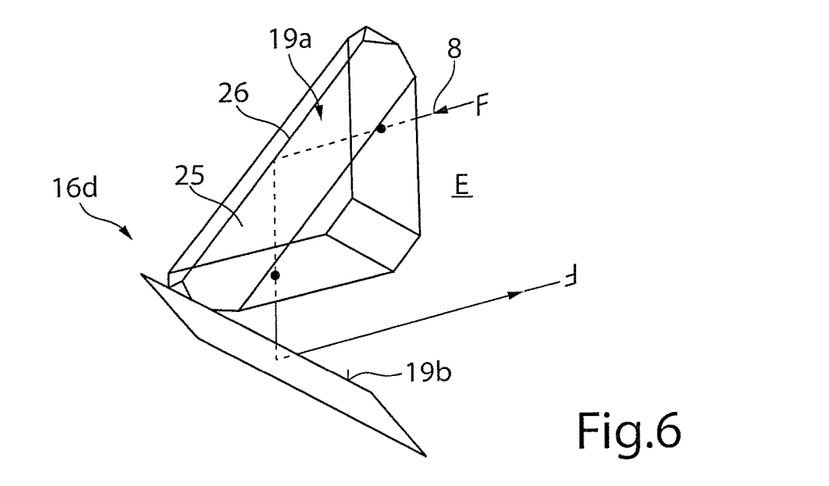
FIG. 6 shows a representation of a deflecting device that has a roof prism for the complete image reversal of the pumping light beam.

FIG. 6 shows an azimuthal deflecting device 16*d*, which has two deflecting faces 19*a*, 19*b*, of which the second deflecting face 19*b* for the 90° deflection is formed on a mirror or on a prism. The first deflecting face 19*a* is formed on a roof prism 25, at the roof edge 26 of which the pumping light beam 8 is deflected by total reflection through 90°, so that altogether a 180° deflection of the pumping light beam 8 is produced. The use of the roof prism 25 in the deflecting device 16*d* has the effect of producing in the 180° deflection an additional image reversal or mirroring at the plane of incidence E (the deflection plane) of the pumping light beam 8, which together with the image reversal at the plane of symmetry 20, not graphically shown in FIG. 6, brings about a complete image reversal of the pumping light beam 8, i.e. the beam cross section of the pumping light beam 8 is rotated by 180°. The effect of the complete image reversal is indicated in FIG. 6 by two representations of the letter "F".

The additional image reversal or mirroring at the plane of incidence E has the effect that the azimuthal deflecting device 16*d* shown in FIG. 6 brings about a radial image reversal, so that it is suitable for correcting the imaging error described further above. Instead of the deflecting system 15 shown in FIG. 5, in which a radial deflection and an azimuthal deflection take place alternately at the first and second annular regions RB1, RB2, using the azimuthal deflecting device 16*d* shown in FIG. 6 allows the formation of a deflecting system 15 that, by analogy with the third, inner annular region RB3 from FIG. 5, produces an exclusively azimuthal deflection also in the first annular region RB1 and in the second annular region RB2 of the reflecting surface 10, without the imaging errors thereby occurring becoming too great. It is not absolutely necessary for each of the azimuthal deflecting devices 16*d* to have a roof prism 25; however, a radial image reversal should take place in at least one third of the deflections with the deflecting system 15. In certain implementations, the radial image reversal takes place in at least half of the deflections with the deflecting system 15.

To increase further the efficiency of the pumping light system 1, the optical path length between two respective ones of the reflecting regions can be optimized for example in the way described in the document DE 10 2011 004 204 A1 cited at the beginning. If appropriate, the lens 9 or some other coupling optics may be designed such that, instead of a collimated pumping light beam 8, a pumping light beam with an input coupling focus is produced, as described in the document DE 10 2013 114 748 A1 cited further above, which is hereby incorporated by reference herein into the content of this application in its entirety. In this case, the deflecting devices 16*a-d*, 17*a, b* and the deflecting faces 19*a*, 19*b* can be arranged in the region of an intermediate focus.

OTHER EMBODIMENTS

A number of embodiments of the invention have been described. Nevertheless, it will be understood that various modifications may be made without departing from the spirit and scope of the invention. Accordingly, other embodiments are within the scope of the following claims.

What is claimed is:
1. A pumping light system for a disc laser comprising:
a focusing device having a reflecting surface for focusing a pumping light beam onto a laser-active medium; and
a deflecting system comprising a plurality of deflecting devices configured for deflecting the pumping light beam between reflecting regions formed on the reflecting surface that are arranged in different angle regions around a central axis of the reflecting surface in at least a first annular region and a second annular region,
wherein the deflecting system is configured to deflect the pumping light beam between two reflecting regions of the first annular region at least once and to deflect the pumping light beam between two reflecting regions of the second annular region at least once,
wherein the deflecting system is configured to deflect the pumping light beam a plurality of times between a plurality of reflecting regions of the of the first annular region and a plurality of reflecting regions of the second annular region with an image reversal of the pumping light beam in the radial direction in relation to the central axis,
wherein the plurality of times of deflecting the pumping light beam between the plurality of reflecting regions of the first annular region and the plurality of reflecting regions of the second annular region with the image reversal of the pumping light beam in the radial direction corresponds to at least one third of a total number of deflections caused by the deflecting system, including deflections:
  i. between the plurality of reflecting regions of the first annular region and the plurality of reflecting regions of the second annular region,
  ii. between the two reflecting regions within the first annular region, and
  iii. between the two reflecting regions within the second annular region.

2. The pumping light system of claim 1, wherein the focusing device comprises a concave mirror.

3. The pumping light system of claim 1, wherein the plurality of times corresponds to at least half of the total number of deflections caused by the deflecting system, including deflections:
  i. between the plurality of reflecting regions of the first annular region and the plurality of reflecting regions of the second annular region,
  ii. between the two reflecting regions within the first annular region, and
  iii. between the two reflecting regions within the second annular region.

4. The pumping light system of to claim 1, wherein the deflecting system is configured to deflect the pumping light beam from a reflecting region of the first annular region onto a reflecting region of the second annular region, or vice versa, for the image reversal of the pumping light beam in the radial direction in relation to the central axis.

5. The pumping light system of claim 4, wherein the deflecting device is configured to deflect the pumping light beam from the reflecting region of the first annular region onto the reflecting region of the second annular region, or vice versa, between each deflection of the pumping light beam between the two reflecting regions of the first annular region and each deflection of the pumping light beam between the two reflecting regions of the second annular region.

6. The pumping light system of claim 1, wherein the deflecting system is configured to deflect the pumping light beam from a reflecting region of the first annular region onto a reflecting region of the second annular region, or vice versa, that deviates by no more than one from the number of deflections between the two reflecting regions of the first annular region and between the two reflecting regions of the second annular region.

7. The pumping light system of claim 1, wherein the deflecting system comprises at least one deflecting device for deflecting the pumping light beam between the two reflecting regions of the reflecting surface that comprises two deflecting faces that are aligned mirror-symmetrically in relation to a plane of symmetry for the image reversal of the pumping light beam with respect to the plane of symmetry.

8. The pumping light system of claim 7, wherein at least one deflecting device is configured for an additional image reversal of the pumping light beam with respect to a plane of incidence of the pumping light beam.

9. The pumping light system of claim 7, wherein the deflecting faces are formed on one or more prisms.

10. The pumping light system of claim 9, wherein one of the deflecting faces for the additional image reversal of the pumping light beam with respect to a plane of incidence of the pumping light beam is formed on a roof prism.

11. The pumping light system of claim 1, wherein the deflecting system is configured to deflect the pumping light beam between two azimuthally neighboring reflecting regions of the first annular region and between two azimuthally neighboring reflecting regions of the second annular region.

12. The pumping light system of claim 1, wherein the deflecting system is configured to deflect the pumping light beam between two radially neighboring reflecting regions of the first annular region and of the second annular region.

13. The pumping light system of claim 1, wherein the first annular region and the second annular region have an equal number of reflecting regions.

14. The pumping light system of claim 13, wherein each of the first annular region and the second annular region comprises fourteen reflecting regions.

15. The pumping light system of claim 1, wherein the reflecting surface comprises at least a third, radially inner annular region that is surrounded by the first and second annular regions of the reflecting surface.

16. The pumping light system of claim 15, wherein the third annular region comprises eight reflecting regions.

17. The pumping light system of claim 16, wherein the deflecting system is configured to deflect the pumping light beam at least twice directly in succession between two reflecting regions of the third annular region.

18. The pumping light system of claim 1, wherein the reflecting surface comprises an aspherical form.

19. The pumping light system of claim 18, wherein the aspherical form comprises a parabolic form.

20. The pumping light system of claim 1, further comprising a pumping light source for generating the pumping light beam.

21. The pumping light system of claim 20, further comprising a collimating optics positioned in the beam path between the pumping light source and the reflecting surface for the collimation of the pumping light beam.

22. The pumping light system of claim 1, further comprising the disc laser and the laser-active medium in the form of a laser disc.

23. A method for pumping a laser-active medium, the method comprising:
repeatedly focusing a pumping light beam onto the laser-active medium via a focusing device, wherein a deflection of the pumping light beam between different reflecting regions of a reflecting surface of the focusing device that are arranged in different angle regions around a central axis of the reflecting surface in at least a first annular region and a second annular region takes place between successive focusing steps, wherein the pumping light beam is deflected at least once both between two reflecting regions of the first annular region and between two reflecting regions of the second annular region,
wherein repeatedly focusing comprises deflecting the pumping light beam a plurality of times between two reflecting regions of the two annular regions with an image reversal of the pumping light beam in the radial direction in relation to the central axis,
wherein the plurality of times of deflecting the pumping light beam between the two reflecting regions of the two annular regions with the image reversal of the pumping light beam in the radial direction corresponds to at least one third of a total number of deflections caused by the deflecting system, including deflections:
  i. between different reflecting regions of the reflecting surface of the focusing device that are arranged in different angle regions around the central axis of the reflecting surface in at least the first annular region and the second annular region,
  ii. between the two reflecting regions within the first annular region, and
  iii. between the two reflecting regions within the second annular region.

24. The method for pumping the laser-active medium of claim 23, wherein the focusing device comprises a concave mirror.

25. The method for pumping the laser-active medium of claim 23, wherein the plurality of times corresponds to at least half of the total number of deflections caused by the deflecting system, including deflections:
  i. between the different reflecting regions of the reflecting surface of the focusing device that are arranged in different angle regions around the central axis of the reflecting surface in at least the first annular region and the second annular region,
  ii. between the two reflecting regions within the first annular region, and
  iii. between the two reflecting regions within the second annular region.

* * * * *

UNITED STATES PATENT AND TRADEMARK OFFICE
CERTIFICATE OF CORRECTION

PATENT NO. : 9,923,330 B2  
APPLICATION NO. : 15/497906  
DATED : March 20, 2018  
INVENTOR(S) : Sven-Silvius Schad et al.

Page 1 of 1

It is certified that error appears in the above-identified patent and that said Letters Patent is hereby corrected as shown below:

In the Claims

Column 15  
Line 58, in Claim 1, delete "of the of the" and insert -- of the --

Column 16  
Line 25, in Claim 4, delete "of to" and insert -- of --

Signed and Sealed this  
Fifteenth Day of May, 2018

Andrei Iancu  
*Director of the United States Patent and Trademark Office*